Sept. 29, 1970 H. R. CAMENZIND 3,531,740

PULSE-WIDTH MODULATION CIRCUIT

Original Filed Jan. 12, 1966

INVENTOR
HANS R. CAMENZIND
BY
Robert Levine
ATTORNEY

United States Patent Office

3,531,740
Patented Sept. 29, 1970

3,531,740
PULSE-WIDTH MODULATION CIRCUIT

Hans R. Camenzind, Lexington, Mass., assignor to P. R. Mallory & Co. Inc., Indianapolis, Ind., a corporation of Delaware Continuation of application Ser. No. 520,218, Jan. 12, 1966. This application May 13, 1969, Ser. No. 826,075
Int. Cl. H03k 7/08, 3/281
U.S. Cl. 332—14 1 Claim

ABSTRACT OF THE DISCLOSURE

A circuit combination of a differential amplifier and a multivibrator which varies the duty-cycle while maintaining substantially the repetition rate of the multivibrator.

The present application is a continuation of application Ser. No. 520,218, filed Jan. 12, 1966, and now abandoned.

The present invention relates to pulse-width modulation circuits and more particularly to the means and methods for producing modulation of the duty-cycle of a square wave without affecting its repetition rate.

A multivibrator generally produces square wave pulses with a 50% duty-cycle, i.e., the two halves of the output waveform occur for an equal time. However, in many applications, one of which is a two-state amplifier, it is necessary for a multivibrator to have an adjustable or variable duty-cycle. In the case of a two-state amplifier it is necessary for the duty-cycle to be linearly related to the input signal.

It is known that the duty-cycle of a multivibrator can be adjusted by varying the charging currents of the two timing capacitors. However, if a variable current source is used as an input to vary the charging rate, the duty-cycle will be a linear function of the input signal but the repetition rate will drop drastically as the duty-cycle increases.

Accordingly, there is presented in this specification the means for varying the duty-cycle as a linear function of the input signal without changing the repetition rate of the output waveform. This objective is met by using the double ended output of a differential amplifier to vary the charging or discharging times of the two capacitors of a multivibrator circuit. One of the outputs of the differential amplifier is coupled to the first capacitor circuits and the other output is coupled to the second capacitor circuit. As the input signal to the differential amplifier increases, one output will increase, making the corresponding time shorter while other output decreases making its corresponding time longer. The result is a duty-cycle modulation of the multivibrator. Since the two-times always add up to a constant value, the repetition rate of the multivibrator does not change.

The circuitry shown in this specification is particularly suited for fabrication by integrated circuit techniques. Hence, the fabrication of high density, low cost circuitry can be achieved.

Other features and advantages of the present invention will become apparent as this specification continues.

It is an object of the present invention, therefore, to provide a circuit means for varying the duty-cycle of a multivibrator without changing the repetition rate of the waveform.

It is another object of the present invention to provide a circuit means for making the duty-cycle of a multivibrator a linear function of the level of the input signal to a differential amplifier.

It is a further object of the present invention to charge the two timing capacitors of a multivibrator with a constant current rather than through a constant resistance.

In this way the linearity of the duty-cycle is ideal and the capacitors can be made much smaller so as to accommodate integrated circuit manufacturing techniques.

It is another object of the present invention to provide a circuit means for varying the duty-cycle of a multivibrator without changing the repetition rate of the waveform and which can be readily manufactured by integrated circuit techniques.

It is still another object of the present invention to provide a means for coupling the double ended output of a differential amplifier to the collector circuits of the transistor of a multivibrator, thereby permitting the collector voltage to vary by an amount determined by the corresponding output of the differential amplifier.

It is still a further object of the present invention to provide a circuit means for coupling the double ended output of a differential amplifier to the base circuits of the transistors of a multivibrator, thereby clamping the voltage at said base circuits at a magnitude determined by the output of said differential amplifier.

The present invention, in another of its aspects, relates to novel features of the instrumentalities described herein for teaching the principal object of the invention and to the novel principles employed in the instrumentalities whether or not these features and principles may be used in the object and/or in the said field.

Other objects of the invention and the nature thereof will become apparent from the following description considered in conjunction with the accompanying drawings and wherein like reference numbers describe elements of similar function therein and wherein the scope of the invention is determined rather from the dependent claims.

For illustrative purposes, the invention will be described in conjunction with the accompanying drawings in which.

Generally speaking, the present invention is a circuit means for varying the duty-cycle while maintaining the repetition rate of the output waveform of a multivibrator of the type having a pair of capacitors for determining the timing of said duty-cycle, said circuit means comprising: a differential amplifier having a single ended input means and a double ended output means; means for connecting a first of said output means to said multivibrator so as to vary the charging voltage of a first of said capacitors; and means for connecting a second of said output means to said multivibrator so as to vary the charging voltage of a second of said capacitors.

Figure 1:
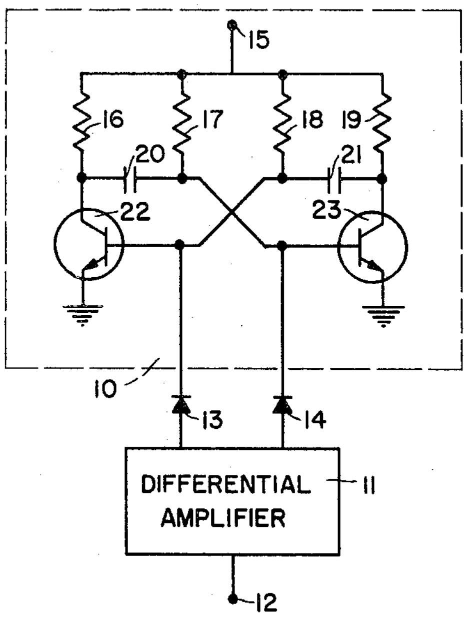
FIG. 1 is a schematic of one embodiment of the present invention illustrating the coupling of the outputs of the differential amplifier to the base circuits of the transistors of the multivibrator.

Referring now to the drawing, and particularly to the schematic of FIG. 1, the component parts of the present invention can be visualized in conjunction with the following description. The multivibrator circuit is shown in the box 10. The differential amplifier 11 with the input terminal 12 is coupled to the multivibrator 10 through the diodes 13 and 14. The cathodes of the diodes 13 and 14 are connected to the base circuits of the transistors 22 and 23 of the multivibrator 10. The multivibrator 10 is a typical multivibrator comprised of the resistors 16, 17, 18 and 19, the capacitors 20 and 21, and the transistors 22 and 23. The positive voltage for the multivibrator 10 is provided at the terminal 15. The input signal to the differential amplifier is provided at the terminal 12.

Figure 2:
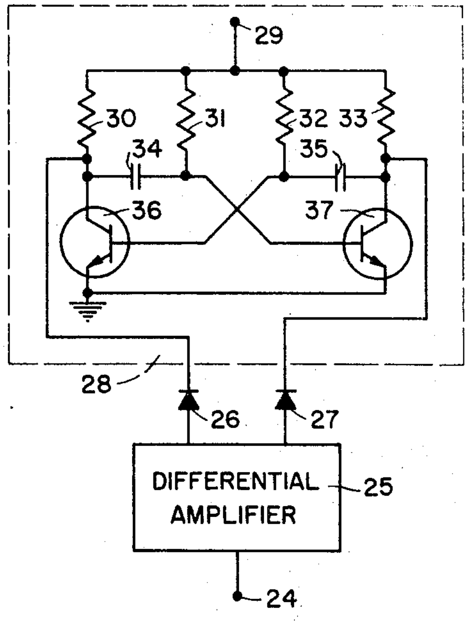
FIG. 2 is a schematic of another embodiment of the present invention illustrating the coupling of the outputs of the differential amplifier to the collector circuits of the transistors of the multivibrator.

Referring now to FIG. 2, another embodiment of the present invention can be discussed. The input to the differential amplifier 25 is provided at the terminal 24. The differential amplifier 25 is coupled to the multivibrator 28 by the diodes 26 and 27. The multivibrator 28 is comprised of the resistors 30, 31, 32 and 33, the capacitors 34 and 35, and the transistors 36 and 37. The cathodes of the diodes 26 and 27 are connected to the collector circuits of the transistors 36 and 37. The positive voltage for operating the multivibrator 28 is provided at the terminal 29.

Figure 3:
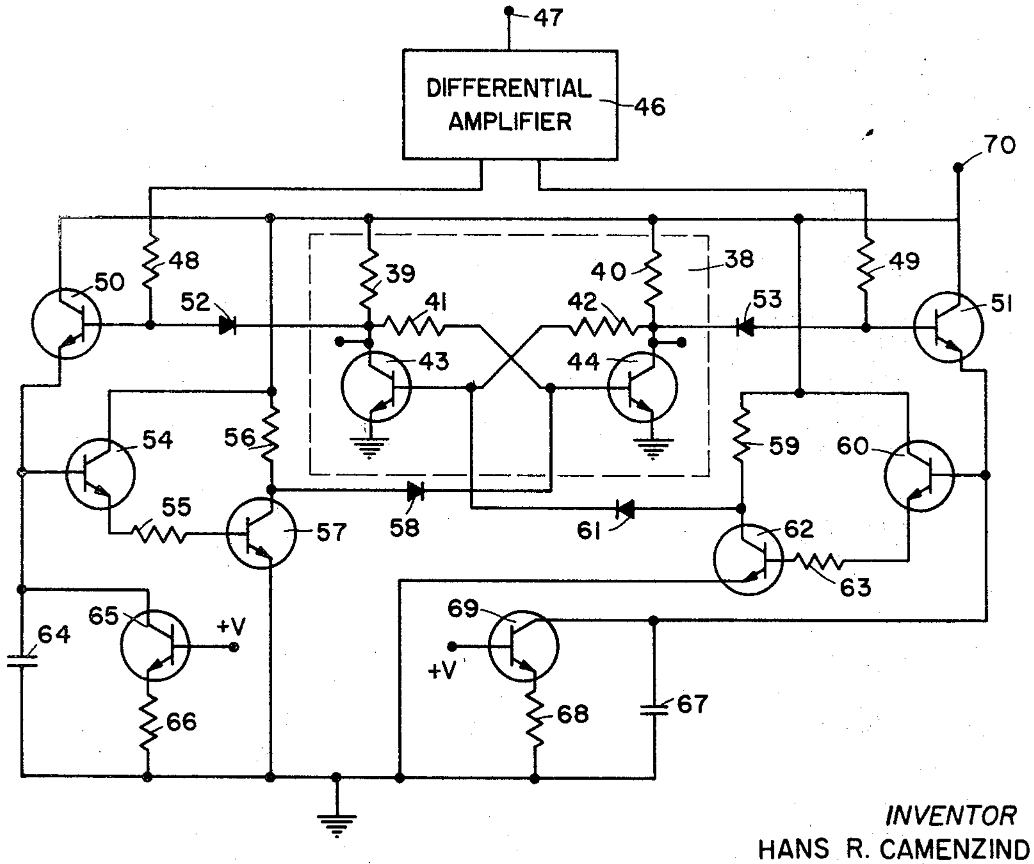
FIG. 3 is a schematic of a third embodiment of the present invention illustrating the charging of the capacitors of the multivibrator with a constant current rather than through a constant resistance.

Referring now to FIG. 3, a third embodiment of the present invention can be discussed. The multivibrator circuit 38, a flip-flop, is comprised of the resistors 39, 40, 41 and 42 and the transistors 43 and 44. The differential amplifier 46 input is provided at the terminal 47. The double ended output of the differential amplifier 46 is connected through resistors 48 and 49 to the balance of the circuitry. The resistor 48 is connected to the base of the transistor 50 and the anode of the diode 52. The cathode of the diode 52 is connected to the collector circuit of the transistor 43 of the multivibrator 38. The resistor 49 is connected to the base of the transistor 51 and to the anode of the diode 53. The cathode of the diode 53 is connected to the collector circuit of the transistor 44 of the multivibrator 38.

The collector of the transistor 50 is connected to the collector of the transistor 54 and to the positive voltage terminal 70 and the emitter of the transistor 50 is connected to the base of the transistor 54. The collector of the transistor 51 is connected to the collector of the transistor 60 and to the positive voltage terminal 70 and the emitter of the transistor 51 is connected to the base of the transistor 60. The emitter of the transistor 54 is connected through the resistor 55 to the base of the transistor 57 and the collector of transistor 54 is connected through the resistor 56 to the collector of the transistor 57. A diode 58 connects the collector of the transistor 57 to the base of the transistor 44. The emitter of the transistor 57 is connected to ground. The collector of the transistor 60 is connected through the resistor 59 to the collector of the transistor 62 and the emitter of the transistor 60 is connected through the resistor 63 to the base of the transistor 62. A diode 61 connects the collector of the transistor 62 to the base of the transistor 43. The emitter of the transistor 62 is connected to ground.

The emitter of the transistor 50 is also connected to a first side of the capacitor 64 and to the collector of the transistor 65. The second side of the capacitor 64 is connected to ground. The base of the transistor 65 is connected directly to the positive side of a voltage source and the emitter of the transistor 65 is connected through the resistor 66 to ground. The emitter of the transistor 51 is connected to a first side of the capacitor 67 and to the collector of the transistor 69. The second side of the capacitor 67 is connected to ground. The emitter of the transistor 69 is connected through the resistor 68 to ground and the base of the transistor 69 is connected directly to the positive side of a voltage source.

With the above description of the circuits in mind, and by making reference to the drawing figures, the following analysis of operation will serve to convey the functional details of the present invention. Referring again to FIG. 1, it can be seen that without the addition of the differential amplifier 11 and the diodes 13 and 14, the voltages at the base of the transistors 22 or 23 would be a negative spike of a predetermined magnitude as the opposite transistor 22 or 23 turns on. The capacitors 20 and 21 are charged through the resistors 17 and 18 from this negative voltage. Hence, the time of one period is determined by the corresponding resistor-capacitor time constant and the magnitude of the negative voltage. By limiting this negative voltage with a diode 13 or 14 connected to a reference voltage provided by the differential amplifier 11, the charging time for the capacitors 20 and 21 can be made a function of the input signal applied to the terminal 12 of the differential amplifier 11. As the input signal to the differential amplifier 11 increases, one of the outputs of said differential amplifier will increase, making the corresponding time smaller while the other output decreases, making its corresponding time longer. The result is a duty-cycle modulation of the multivibrator 10. Since the two times always add up to a constant value, the repetition rate of the multivibrator does not change.

A slightly different circuit for providing a duty-cycle modulation of a multivibrator is shown in FIG. 2. Instead of clamping the voltage at the bases of the transistors 36 and 37, as it is shown in FIG. 1, the diodes 26 and 27 are connected to the collector of the transistors 36 and 37. In this embodiment the collector voltage is allowed to drop by an amount determined by the corresponding output of the differential amplifier 25 and the negative voltage at the base of the opposite transistor will be of equal magnitude.

It is desirable to charge the two capacitors of a multivibrator with a constant current rather than through a constant resistance. In this way the linearity of the duty-cycle is ideal and the capacitors can be made much smaller. Such an embodiment is illustrated in FIG. 3. The circuitry shown in the box 38 is a multivibrator or flip-flop. Hence, one of the transistors 43 or 44 is always turned on, but it is not possible for both transistors to be turned on at the same time.

For analysis purposes, assume that the transistor 43 is in the off state, i.e., its collector is near the supply voltage 70. At that state, the capacitor 64 is charged through the transistor 50 up to a level determined by the output of the differential amplifier 46 provided through the resistor 48. In the meantime, the flip-flop 38 is triggered from the other half of the circuit and the collector voltage at the transistor 43 drops to zero, thereby removing the charge voltage from the capacitor 64. The capacitor 64 is then slowly discharged with a constant current through the transistor 65 and the resistor 66. As soon as the voltage at the base of the transistor 54 (i.e., the voltage across the capacitor 64) drops to a predetermined level, both of the transistors 54 and 57 turn off and the voltage on the collector of the transistor 57 rises to trigger the flip-flop. The identical procedure now follows with the other half of the circuit.

The time of each period of the multivibrator of FIG. 3 is clearly a function of the voltage to which each capacitor 64 and 67 is recharged. But since this voltage is the output voltage of the differential amplifier 46, the length of each period is related to the input signal provided to the differential amplifier 46 at the terminal 47. As the input signal to the differential amplifier 46 increases, one output of the differential amplifier 46 increases, charging its associated capacitor to a higher voltage and thus lengthening the discharging time, while the other output decreases and thus shortens the discharge time of its associated capacitor. The result is a width-modulated pulse train at the collectors of the transistors 43 and 44 with a constant repetition rate.

The pulse-width modulation circuitry of the present invention, as hereinbefore described in three embodiments, is merely illustrative and not exhaustive in scope. Since many widely different embodiments of the invention can be made without departing from the scope thereof, it is intended that all matter contained in the above description and shown in the accompanying drawing shall be interposed as illustrative and not in a limiting sense.

What is claimed is:

1. An improved control circuit for use in connection with a differential amplifier and a multi-vibrator, the system comprising:

a differential amplifier having an input and two outputs;

a multi-vibrator comprising:

a first and a second transistor, each having a collector, emitter and base, the emitter of each of said first and said second transistors being connected to ground, a first and a second impedance means connected, respectively, between the base of one transistor and the collector of the other of said transistors, a third and fourth impedance means each having one of their ends respectively connected to a respective collector of said first and said second transistors, the other ends of said third and said fourth impedance means being connected to a common voltage supply terminal, a control circuit means including;

a respective impedance network comprised of a plurality of transistors, resistors and diodes, connected to a respective output of said differential amplifier, each of said respective impedance networks being further coupled to the collector of one of said first and said second transistors and the base of the other of said first and said second transistors, and a respective parallel circuit comprised of a capacitor and a transistor connected between ground and said respective impedance network such that as the input signal to the differential amplifier increases, one output of said differential amplifier increases thereby charging its associated capacitor to a higher voltage resulting in a shortening of the discharge time, while the other output of said differential amplifier decreases resulting in a shortening of the discharge time of its associated capacitor, the overall operation of the circuit being such as to provide a width-modulated pulse train signal at the collectors of said first and said second transistors, said pulse train signal having a constant repetition rate.

References Cited

UNITED STATES PATENTS

| | | | |
|---|---|---|---|
| 3,037,172 | 5/1962 | Biard | 332—14 |
| 3,152,306 | 10/1964 | Cooper et al. | 331—113 |
| 3,271,697 | 9/1966 | Gardner | 331—113 |

ALFRED L. BRODY, Primary Examiner

U.S. Cl. X.R.

307—291; 328—194; 331—113, 145